(12) United States Patent
Soeno

(10) Patent No.: US 9,679,997 B2
(45) Date of Patent: Jun. 13, 2017

(54) SEMICONDUCTOR DEVICE WITH SUPPRESSED TWO-STEP ON PHENOMENON

(71) Applicant: Toyota Jidosha Kabushiki Kaisha, Toyota-shi Aichi-ken (JP)

(72) Inventor: Akitaka Soeno, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/157,987

(22) Filed: May 18, 2016

(65) Prior Publication Data

US 2016/0359027 A1 Dec. 8, 2016

(30) Foreign Application Priority Data

Jun. 3, 2015 (JP) ................................ 2015-112904

(51) Int. Cl.

| H01L 29/00 | (2006.01) |
|---|---|
| H01L 29/739 | (2006.01) |
| H01L 29/10 | (2006.01) |
| H01L 29/06 | (2006.01) |
| H01L 29/08 | (2006.01) |
| H01L 29/861 | (2006.01) |
| H01L 29/36 | (2006.01) |

(52) U.S. Cl.
CPC ...... H01L 29/7397 (2013.01); H01L 29/0696 (2013.01); H01L 29/0834 (2013.01); H01L 29/1095 (2013.01); H01L 29/7395 (2013.01); H01L 29/36 (2013.01); H01L 29/861 (2013.01); H01L 2924/13055 (2013.01)

(58) Field of Classification Search
CPC ............ H01L 29/1095; H01L 29/7397; H01L 29/0696; H01L 29/7395; H01L 2924/13055
See application file for complete search history.

(56) References Cited

U.S. PATENT DOCUMENTS

| 8,742,454 B2 * | 6/2014 | Iwasaki ............... H01L 29/7393 257/140 |
|---|---|---|
| 2014/0048847 A1 | 2/2014 | Yamashita et al. |
| 2016/0240641 A1 * | 8/2016 | Okawara ............. H01L 29/7397 |
| 2016/0351561 A1 * | 12/2016 | Senoo ................ H01L 27/0635 |
| 2016/0351562 A1 * | 12/2016 | Senoo ................ H01L 27/0664 |

FOREIGN PATENT DOCUMENTS

JP 2013-048230 A 3/2013

* cited by examiner

*Primary Examiner* — Ngan Ngo
(74) *Attorney, Agent, or Firm* — Dinsmore & Shohl LLP

(57) ABSTRACT

A semiconductor device includes an IGBT region with a bottom-body region on a front surface side of an IGBT drift region, an IGBT barrier region on a front surface side of the bottom-body region, and a top-body region on a front surface side of the IGBT barrier region. A diode region is include with a bottom-anode region on a front surface side of the diode drift region, a diode barrier region on a front surface side of the bottom-anode region, a top-anode region on a front surface side of the diode barrier region, and a pillar region extending from the front surface of the semiconductor substrate, piercing the top-anode region, and reaching the diode barrier region, and connected to the front surface electrode and the diode barrier region. An impurity concentration of the top-body region is lower than an impurity concentration of the bottom-anode region.

3 Claims, 9 Drawing Sheets

SEMICONDUCTOR DEVICE WITH SUPPRESSED TWO-STEP ON PHENOMENON

CROSS-REFERENCE TO RELATED APPLICATION

This application claims priority to Japanese Patent Application No. 2015-112904 filed on Jun. 3, 2015, the entire contents of which are hereby incorporated by reference into the present application.

TECHNICAL FIELD

The present application relates to a semiconductor device.

DESCRIPTION OF RELATED ART

As shown in FIG. 8, a semiconductor device disclosed in Japanese Patent Application Publication No. 2013-048230 includes a semiconductor substrate 102, and a front surface electrode 105 configured of metal provided on a front surface of the semiconductor substrate 102. The semiconductor substrate 102 includes an IGBT region 103 and a diode region 104. The front surface electrode 105 is configured of a low barrier-height metal such as titanium (Ti), for example.

The IGBT region 103 includes an n-type drift region 113, a p-type bottom-body region 114 provided on a front surface side of the drift region 113, an n-type barrier region 115 provided on a front surface side of the bottom-body region 114, a p-type top-body region 116 provided on a front surface side of the barrier region 115, and n-type emitter regions 117 provided on a front surface side of the top-body region 116. Moreover, the IGBT region 103 includes an n-type pillar region 120 extending from the front surface of the semiconductor substrate 102, piercing the top-body region 116, and reaching the barrier region 115, and connected to the front surface electrode 105 and the barrier region 115. The front surface electrode 105 and the pillar region 120 are Schottky-connected to each other. Moreover, the IGBT region 103 includes gate trenches 130 extending from the front surface of the semiconductor substrate 102, piercing the emitter regions 117, the top-body region 116, the barrier region 115, and the bottom-body region 114, and reaching the drift region 113.

The diode region 104 includes the n-type drift region 113, a p-type bottom-anode region 122 provided on the front surface side of the drift region 113, an n-type barrier region 125 provided on a front surface side of the bottom-anode region 122, and a p-type top-anode region 123 provided on a front surface side of the barrier region 125. Moreover, the diode region 104 includes an n-type pillar region 120 extending from the front surface of the semiconductor substrate 102, piercing the top-anode region 123, and reaching the barrier region 125, and connected to the front surface electrode 105 and the barrier region 125. The front surface electrode 105 and the pillar region 120 are Schottky-connected to each other. Moreover, the diode region 104 includes a gate trench 130 extending from the front surface of the semiconductor substrate 102, piercing the top-anode region 123, the barrier region 125, and the bottom-anode region 122, and reaching the drift region 113.

When the semiconductor device in Japanese Patent Application Publication No. 2013-048230 is turned on, a channel is provided in a range of each of the bottom-body region 114 and the top-body region 116, the range being in contact with the corresponding gate trench 130. Electrons then flow from the front surface electrode 105 to the drift region 113 via the emitter regions 117, the channel provided in the top-body region 116, the barrier region 115, and the channel provided in the bottom-body region 114. Moreover, when the semiconductor device is turned on, a channel is also provided in a range of the bottom-anode region 122, the range being in contact with the corresponding gate trench 130.

SUMMARY

In the semiconductor device as described above, when each region is formed in the semiconductor substrate 102, p-type or n-type impurities are generally implanted into the semiconductor substrate 102. Accordingly, when the bottom-body region 114 and the top-body region 116 are respectively formed in the semiconductor substrate 102, p-type impurities are implanted into positions that correspond to the bottom-body region 114 and the top-body region 116, respectively. Moreover, when the bottom-anode region 122 and the top-anode region 123 are formed in the semiconductor substrate 102, p-type impurities are implanted into positions that correspond to the bottom-anode region 122 and the top-anode region 123, respectively.

When impurities are implanted into the semiconductor substrate 102 to form the bottom-body region 114 and the top-body region 116 in the IGBT region 103, the position of the bottom-body region 114 is located deeper than the position of the top-body region 116, and hence implantation of impurities into the position of the bottom-body region 114 is more difficult than implantation of impurities into the position of the top-body region 116. Therefore, when the bottom-body region 114 and the top-body region 116 are formed by implanting the impurities into the semiconductor substrate 102, an impurity concentration of the bottom-body region 114 usually is lower than an impurity concentration of the top-body region 116.

Moreover, when the bottom-anode region 122 in the diode region 104 is compared with the top-body region 116 in the IGBT region 103, the position of the bottom-anode region 122 is located deeper than the position of the top-body region 116, and hence implantation of impurities into the position of the bottom-anode region 122 is more difficult than implantation of impurities into the position of the top-body region 116. Therefore, when the bottom-anode region 122 and the top-body region 116 are formed by implanting impurities into the semiconductor substrate 102, an impurity concentration of the bottom-anode region 122 usually becomes lower than an impurity concentration of the top-body region 116.

Moreover, by ensuring the top-body region 116, in which impurities are generally less likely to exhibit variations in implanted depth when the impurities are implanted into the semiconductor substrate 102, to have a high impurity concentration, the top-body region 116 is intended to determine a threshold voltage at which the semiconductor device is turned on.

If the impurity concentration of the bottom-body region 114 is lower than the impurity concentration of the top-body region 116, in the IGBT region 103, a threshold value for forming a channel in the bottom-body region 114 is lower than a threshold value for forming a channel in the top-body region 116. Therefore, when the semiconductor device is turned on, a channel is formed earlier in the bottom-body region 114 than in the top-body region 116. As shown by an arrow Q11 in FIG. 8, when a channel is formed earlier in the bottom-body region 114, electrons flow from the front surface electrode 105 to the drift region 113 via the corresponding pillar region 120, the barrier region 115, and the channel formed in the bottom-body region 114, in the IGBT region 103. In other words, electrons flow by bypassing the top-body region 116. Afterwards, as shown by an arrow Q2 in FIG. 8, when a channel is formed in the top-body region 116, electrons flow from the front surface electrode 105 to the drift region 113 via the emitter regions 117, the channel formed in the top-body region 116, the barrier region 115, and the channel formed in the bottom-body region 114. In other words, electrons flow without bypassing the top-body region 116.

Moreover, if the bottom-anode region 122 in the diode region 104 is compared with the top-body region 116 in the IGBT region 103, and the impurity concentration of the bottom-anode region 122 is lower than the impurity concentration of the top-body region 116, a threshold value for forming a channel in the bottom-anode region 122 is lower than a threshold value for forming a channel in the top-body region 116. Therefore, when the semiconductor device is turned on, a channel is formed earlier in the bottom-anode region 122 than in the top-body region 116. As shown by an arrow Q12 in FIG. 8, when a channel is formed earlier in the bottom-anode region 122, electrons flow from the front surface electrode 105 to the drift region 113 via the corresponding pillar region 120, the barrier region 125, and the channel formed in the bottom-anode region 122, in the diode region 104. In other words, the electrons flow in a region different from the top-body region 116. Afterwards, as shown by the arrow Q2 in FIG. 8, when a channel is formed in the top-body region 116, electrons flow from the front surface electrode 105 to the drift region 113 via the emitter regions 117, the channel formed in the top-body region 116, the barrier region 115, and the channel formed in the bottom-body region 114, in the IGBT region 103. In other words, electrons flow without bypassing the top-body region 116.

As such, when the semiconductor device is turned on, electrons flow by bypassing the top-body region 116 as a first step, and then flow without bypassing the top-body region 116 as a second step. Electrons thereby flow in two steps, and hence as shown in FIG. 9, a current Ic increases in two steps relative to an increase in gate voltage Vg, causing a phenomenon referred to as the so-called two-step ON. Such a two-step ON phenomenon causes a malfunction, a noise, a determination error on a defective product, and the like.

Moreover, in the above-described semiconductor device, the pillar region 120 was provided in the IGBT region 103. However, even in a configuration in which the pillar region 120 was not provided in the IGBT region 103, a similar problem occurred. In this configuration, when the semiconductor device is turned on, a channel is formed earlier in the bottom-anode region 122 in the diode region 104 than in the top-body region 116 in the IGBT region 103, and as in the arrow Q12 shown in FIG. 8, electrons flow from the front surface electrode 105 to the drift region 113 via the corresponding pillar region 120, the barrier region 125, and the channel formed in the bottom-anode region 122, in the diode region 104. Afterwards, when a channel is formed in the top-body region 116, as in the arrow Q2 shown in FIG. 8, electrons flow from the front surface electrode 105 to the drift region 113 via the emitter regions 117, the channel formed in the top-body region 116, the barrier region 115, and the channel formed in the bottom-body region 114, in the IGBT region 103. As such, electrons flow in two steps, disadvantageously causing the two-step ON phenomenon.

Accordingly, the present disclosure provides an art capable of suppressing a two-step ON phenomenon when a semiconductor device is turned on.

A semiconductor device disclosed herein comprises a semiconductor substrate; and a front surface electrode configured of metal provided on a front surface of the semiconductor substrate. The semiconductor substrate comprises an IGBT (Insulated Gate Bipolar Transistor) region and a diode region. The IGBT region comprises: an n-type IGBT drift region; a p-type bottom-body region provided on a front surface side of the IGBT drift region; an n-type IGBT barrier region provided on a front surface side of the bottom-body region; a p-type top-body region provided on a front surface side of the IGBT barrier region; and an n-type emitter region provided on a front surface side of the top-body region. The semiconductor substrate further comprises a gate trench extending from the front surface of the semiconductor substrate, piercing the emitter region, the top-body region, the IGBT barrier region and the bottom-body region, and reaching the IGBT drift region. The diode region comprises: an n-type diode drift region; a p-type bottom-anode region provided on a front surface side of the diode drift region; an n-type diode barrier region provided on a front surface side of the bottom-anode region; and a p-type top-anode region provided on a front surface side of the diode barrier region. The diode region comprises an n-type pillar region extending from the front surface of the semiconductor substrate, piercing the top-anode region, and reaching the diode barrier region, and connected to the front surface electrode and the diode barrier region. The diode region further comprises a gate trench extending from the front surface of the semiconductor substrate, piercing the top-anode region, the diode barrier region and the bottom-anode region, and reaching the diode drift region. An impurity concentration of the top-body region is lower than an impurity concentration of the bottom-anode region.

According to such a configuration, the impurity concentration of the top-body region in the IGBT region is lower than the impurity concentration of the bottom-anode region in the diode region, and hence a threshold value for forming a channel in the top-body region is lower than a threshold value for forming a channel in the bottom-anode region. Therefore, when the semiconductor device is turned on, a channel is formed earlier in the top-body region in the IGBT region than in the bottom-anode region in the diode region, and then a channel is formed in the bottom-anode region. Moreover, a channel is also formed in the bottom-body region in the IGBT region. In the IGBT region, electrons then flow from the front surface electrode to the IGBT drift region via the emitter region, the channel formed in the top-body region, the IGBT barrier region, and the channel formed in the bottom-body region. Unlike the above-mentioned conventional art, a channel is thereby not formed earlier in the bottom-anode region than in the top-body region, and hence electrons do not flow by bypassing the top-body region, and do not flow in two steps. Therefore, the two-step ON phenomenon when the semiconductor device is turned on can be suppressed.

DETAILED DESCRIPTION

Figure 1:
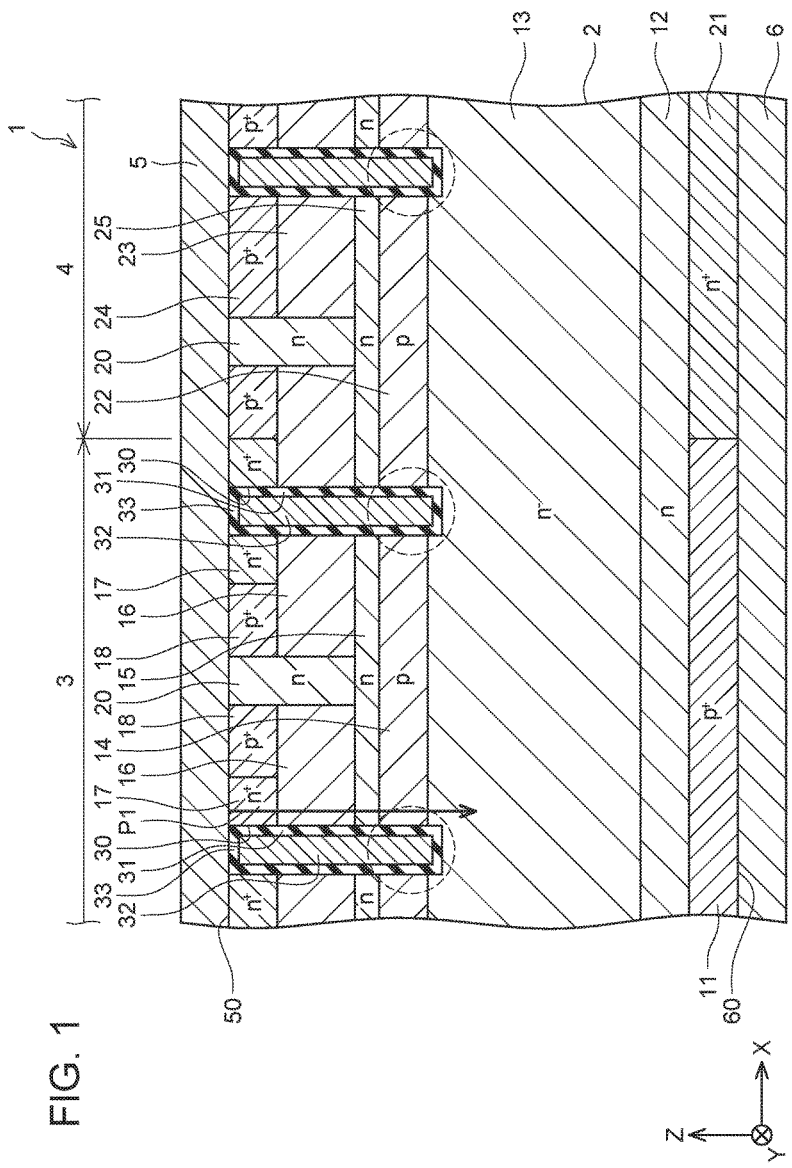
FIG. 1 is a cross-sectional view of a semiconductor device according to an embodiment.

As shown in FIG. 1, a semiconductor device 1 according to an embodiment comprises a semiconductor substrate 2, a front surface electrode 5 provided on a front surface 50 of the semiconductor substrate 2, and a back surface electrode 6 provided on a back surface 60 of the semiconductor substrate 2.

The semiconductor substrate 2 comprises an IGBT region 3 and a diode region 4. The IGBT region 3 and the diode region 4 are provided adjacently. The IGBT region 3 and the diode region 4 are aligned in a lateral direction (x direction). Semiconductor elements are provided in the semiconductor substrate 2. An IGBT (Insulated Gate Bipolar Transistor) is provided in the IGBT region 3 of the semiconductor substrate 2. An FWD (Free Wheeling Diode) is provided in the diode region 4 of the semiconductor substrate 2. The IGBT and the FWD are provided in the same semiconductor substrate 2. The IGBT and the FWD are provided in an anti-parallel state. An RC-IGBT (Reverse Conducting Insulated Gate Bipolar Transistor) is thereby provided.

The front surface electrode 5 and the back surface electrode 6 are configured of metal such as titanium (Ti), aluminum silicon (AlSi), or aluminum (Al), for example. The front surface electrode 5 covers the front surface 50 of the semiconductor substrate 2. The back surface electrode 6 covers the back surface 60 of the semiconductor substrate 2. Each of the front surface electrode 5 and the back surface electrode 6 is provided across the IGBT region 3 and the diode region 4 of the semiconductor substrate 2.

A collector region 11, a buffer region 12, a drift region 13, a bottom-body region 14, a barrier region 15, a top-body region 16, emitter regions 17, and body contact regions 18 are provided in this order in the IGBT region 3 of the semiconductor substrate 2, from a back surface 60 side toward a front surface 50 side. Moreover, a cathode region 21, the buffer region 12, the drift region 13, a bottom-anode region 22, a barrier region 25, a top-anode region 23, and an anode contact region 24 are provided in this order in the diode region 4 of the semiconductor substrate 2, from the back surface 60 side toward the front surface 50 side. The buffer region 12 and the drift region 13 are provided in common in the IGBT region 3 and the diode region 4. Moreover, a plurality of pillar regions 20 is provided in the semiconductor substrate 2. Moreover, a plurality of gate trenches 30 is provided in the semiconductor substrate 2.

[IGBT Region 3]

The collector region 11 is a p-type region. The collector region 11 has a high impurity concentration. The collector region 11 is provided on a back surface side of the buffer region 12. The collector region 11 is provided in a range of the semiconductor substrate 2 that is exposed on the back surface 60. The collector region 11 is in ohmic contact with the back surface electrode 6.

The buffer region 12 is an n-type region. The buffer region 12 is provided on a front surface side of the collector region 11. The buffer region 12 is provided between the collector region 11 and the drift region 13.

The drift region 13 is an n-type region. An impurity concentration of the drift region 13 is lower than an impurity concentration of the buffer region 12. The drift region 13 is provided on a front surface side of the buffer region 12. The drift region 13 is provided between the buffer region 12 and the bottom-body region 14.

The bottom-body region 14 is a p-type region. An impurity concentration of the bottom-body region 14 is lower than an impurity concentration of the collector region 11. The bottom-body region 14 is provided on a front surface side of the drift region 13. The bottom-body region 14 is provided between the drift region 13 and the barrier region 15. The bottom-body region 14 is provided in a range that is in contact with the gate trenches 30. When a gate electrode 32 in each gate trench 30 is placed at an ON potential, a channel is formed in a range of the bottom-body region 14 that is in contact with the gate trench 30.

The barrier region 15 is an n-type region. An impurity concentration of the barrier region 15 is higher than the impurity concentration of the drift region 13. The barrier region 15 is provided on a front surface side of the bottom-body region 14. The barrier region 15 is provided between the bottom-body region 14 and the top-body region 16. The barrier region 15 is provided in a range that is in contact with the gate trenches 30.

The top-body region 16 is a p-type region. The top-body region 16 is provided on a front surface side of the barrier region 15. The top-body region 16 is provided between the barrier region 15, and the emitter regions 17 and the body contact regions 18. The top-body region 16 is provided in a range that is in contact with the gate trenches 30. When the gate electrode 32 in each gate trench 30 is placed at an ON potential, a channel is provided in a range of the top-body region 16 that is in contact with the gate trench 30.

An impurity concentration of the top-body region 16 is lower than the impurity concentration of the bottom-body region 14 (the impurity concentration of the bottom-body region 14 is higher than the impurity concentration of the top-body region 16). A comparison between the impurity concentration of the top-body region 16 and the impurity concentration of the bottom-body region 14 can be made by contrasting average impurity concentrations thereof, for example. By adjusting energy used when impurities are implanted into each region, it is possible to adjust the impurity concentration of the top-body region 16 and the impurity concentration of the bottom-body region 14.

Figure 2:
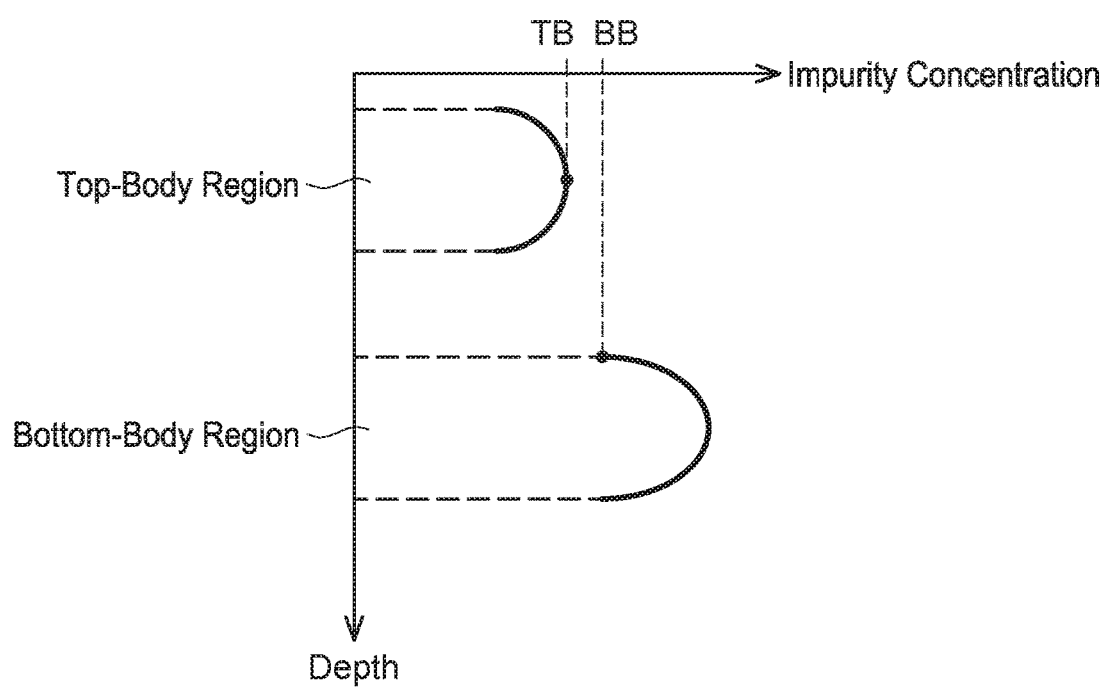
FIG. 2 is a diagram that schematically shows a distribution in impurity concentration in a bottom-body region and a distribution in impurity concentration in a top-body region.

There is a distribution in impurity concentration in the bottom-body region 14. As shown in FIG. 2, when the semiconductor substrate 2 is viewed in cross section, the bottom-body region 14 has a part having a relatively high impurity concentration and a part having a relatively low impurity concentration. Moreover, there is also a distribution in impurity concentration in the top-body region 16. As shown in FIG. 2, when the semiconductor substrate 2 is viewed in cross section, the top-body region 16 also has a part having a relatively high impurity concentration and a part having a relatively low impurity concentration. A range where the impurity concentration is distributed in the bottom-body region 14 and a range where the impurity concentration is distributed in the top-body region 16 do not overlap with each other. That is, an impurity concentration TB of a part having the highest impurity concentration in the top-body region 16 is lower than an impurity concentration BB of a part having the lowest impurity concentration in the bottom-body region 14.

Each emitter region 17 is an n-type region. An impurity concentration of the emitter region 17 is higher than the impurity concentration of the barrier region 15. The emitter region 17 is provided on a front surface side of the top-body region 16. The emitter region 17 is provided in a range that is in contact with the corresponding gate trench 30. The emitter regions 17 are provided in a range of the semiconductor substrate 2 that is exposed on the front surface 50, in an island-like manner. Each emitter region 17 is in ohmic contact with the front surface electrode 5.

Each body contact region 18 is a p-type region. An impurity concentration of the body contact region 18 is higher than the impurity concentration of the top-body region 16. The body contact region 18 is provided on the front surface side of the top-body region 16. The body contact regions 18 are provided in a range of the semiconductor substrate 2 that is exposed on the front surface 50, in an island-like manner. Each body contact region 18 is in ohmic contact with the front surface electrode 5.

[Diode Region 4]

The cathode region 21 is an n-type region. An impurity concentration of the cathode region 21 is higher than the impurity concentration of the buffer region 12. The cathode region 21 is provided on a back surface side of the buffer region 12. The cathode region 21 is provided in a range of the semiconductor substrate 2 exposed on the back surface 60. The cathode region 21 is in ohmic contact with the back surface electrode 6.

The buffer region 12 is provided on a front surface side of the cathode region 21. The buffer region 12 is provided between the cathode region 21 and the drift region 13. The drift region 13 is provided between the buffer region 12 and the bottom-anode region 22. The buffer region 12 and the drift region 13 are provided across the IGBT region 3 and the diode region 4. The bottom-anode region 22 is a p-type region. An impurity concentration of the bottom-anode region 22 is equal to the impurity concentration of the bottom-body region 14. The bottom-anode region 22 is provided on the front surface side of the drift region 13. The bottom-anode region 22 is provided between the drift region 13 and the barrier region 25. The bottom-anode region 22 is provided in a range that is in contact with the gate trenches 30. When the gate electrode 32 in each gate trench 30 is placed at an ON potential, a channel is provided in a range of the bottom-anode region 22 that is in contact with the gate trench 30.

The barrier region 25 is an n-type region. An impurity concentration of the barrier region 25 is higher than the impurity concentration of the drift region 13. The barrier region 25 is provided on a front surface side of the bottom-anode region 22. The barrier region 25 is provided between the bottom-anode region 22 and the top-anode region 23. The barrier region 25 is provided in a range that is in contact with the gate trenches 30.

The top-anode region 23 is a p-type region. An impurity concentration of the top-anode region 23 is equal to the impurity concentration of the top-body region 16. The top-anode region 23 is provided on a front surface side of the barrier region 25. The top-anode region 23 is provided between the barrier region 25 and the anode contact region 24. The top-anode region 23 is provided in a range that is in contact with the gate trenches 30.

The impurity concentration of the top-anode region 23 is lower than the impurity concentration of the bottom-anode region 22 (the impurity concentration of the bottom-anode region 22 is higher than the impurity concentration of the top-anode region 23). A comparison between the impurity concentration of the top-anode region 23 and the impurity concentration of the bottom-anode region 22 can be made by contrasting the average impurity concentrations thereof, for example. By adjusting energy used when impurities are implanted into each region, it is possible to adjust the impurity concentration of the top-anode region 23 and the impurity concentration of the bottom-anode region 22.

Figure 3:
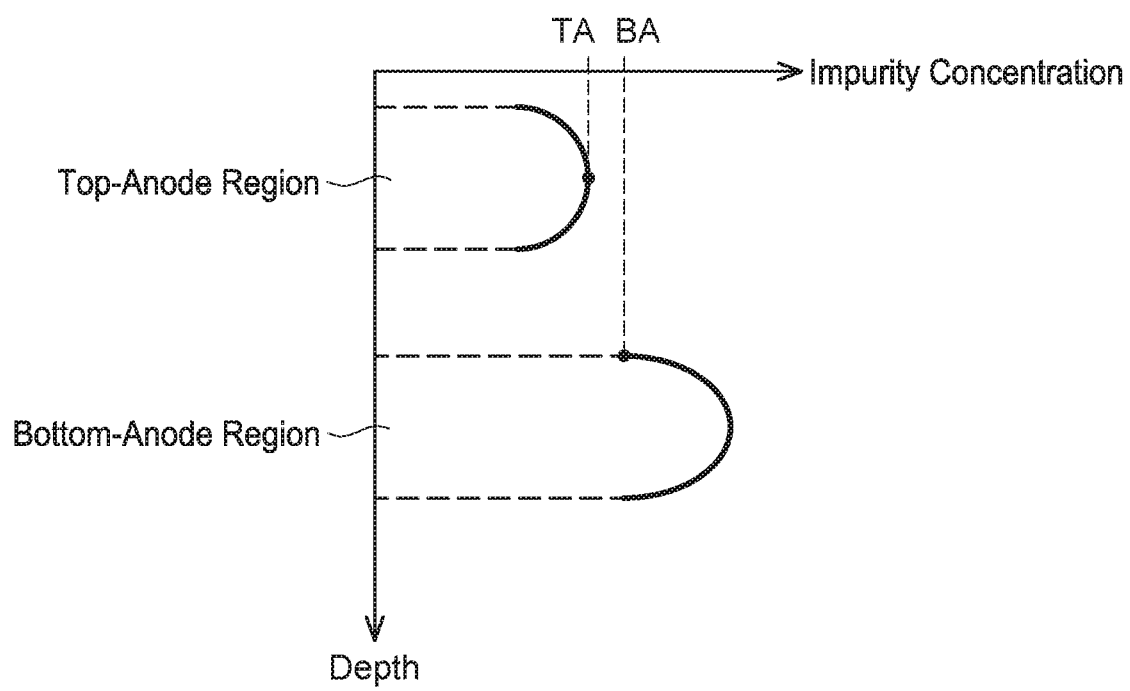
FIG. 3 is a diagram that schematically shows a distribution in impurity concentration in a bottom-anode region and a distribution in impurity concentration in a top-anode region.

There is a distribution in impurity concentration in the bottom-anode region 22. As shown in FIG. 3, when the semiconductor substrate 2 is viewed in cross section, the bottom-anode region 22 has a part having a relatively high impurity concentration and a part having a relatively low impurity concentration. Moreover, there is also a distribution in impurity concentration in the top-anode region 23. As shown in FIG. 3, when the semiconductor substrate 2 is viewed in cross section, the top-anode region 23 also has a part having a relatively high impurity concentration and a part having a relatively low impurity concentration. A range where the impurity concentration is distributed in the bottom-anode region 22 and a range where the impurity concentration is distributed in the top-anode region 23 do not overlap with each other. That is, an impurity concentration TA of a part having the highest impurity concentration in the top-anode region 23 is lower than an impurity concentration BA of a part having the lowest impurity concentration in the bottom-anode region 22.

Moreover, when the impurity concentration of the top-body region 16 in the IGBT region 3 is compared with the impurity concentration of the bottom-anode region 22 in the diode region 4, the impurity concentration of the top-body region 16 is lower than the impurity concentration of the bottom-anode region 22 (the impurity concentration of the bottom-anode region 22 is higher than the impurity concentration of the top-body region 16). A comparison between the impurity concentration of the top-body region 16 and the impurity concentration of the bottom-anode region 22 can be made by contrasting the average impurity concentrations thereof, for example. By adjusting energy used when impurities are implanted into each region, it is possible to adjust the impurity concentration of the top-body region 16 and the impurity concentration of the bottom-anode region 22.

Figure 4:
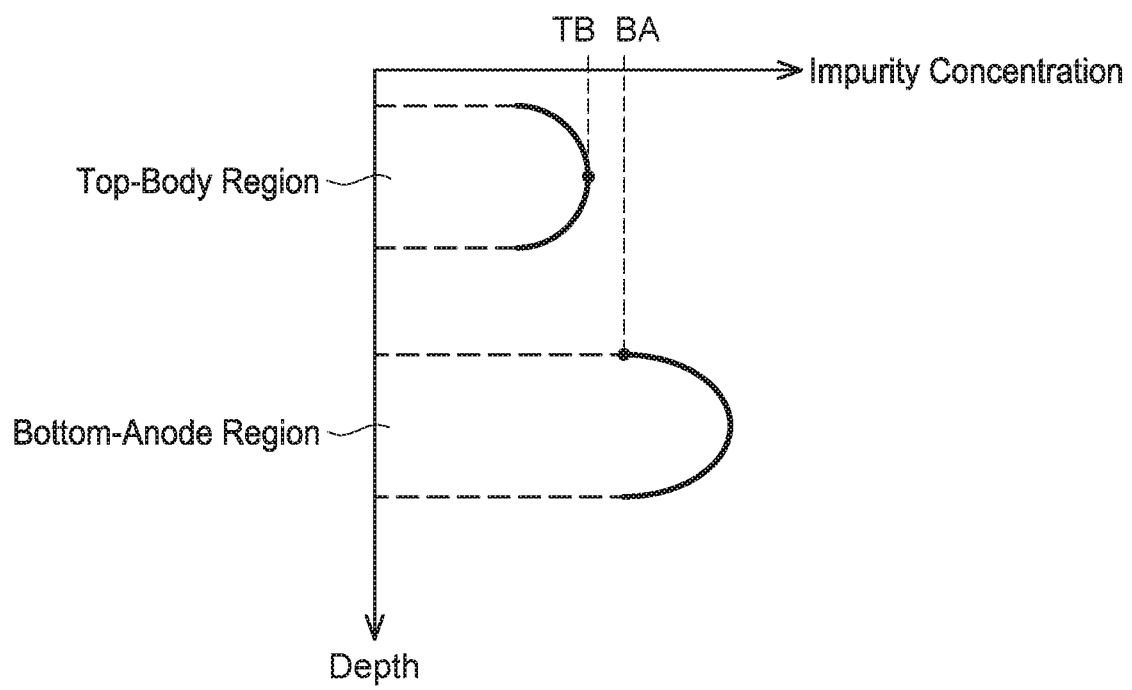
FIG. 4 is a diagram that schematically shows the distribution in impurity concentration in the bottom-anode region and the distribution in impurity concentration in the top-body region.

As shown in FIG. 4, when the range where the impurity concentration is distributed in the top-body region 16 is compared with the range where the impurity concentration is distributed in the bottom-anode region 22, both of them do not overlap with each other. That is, the impurity concentration TB of the part having the highest impurity concentration in the top-body region 16 is lower than the impurity concentration BA of the part having the lowest impurity concentration in the bottom-anode region 22.

The anode contact region 24 is a p-type region. An impurity concentration of the anode contact region 24 is higher than the impurity concentration of the top-anode region 23. The anode contact region 24 is provided on a front surface side of the top-anode region 23. The anode contact region 24 is provided in a range of the semiconductor substrate 2 that is exposed on the front surface 50, in an island-like manner. The anode contact region 24 is in ohmic contact with the front surface electrode 5.

Each pillar region 20 is an n-type region. An impurity concentration of the pillar region 20 is equal to the impurity concentration of the barrier region 15, 25. The impurity concentration of the pillar region 20 is higher than the impurity concentration of the drift region 13. In the IGBT region 3, the pillar region 20 extends from the front surface 50 of the semiconductor substrate 2, pierces the top-body region 16, and reaches the barrier region 15. In the diode region 4, the pillar region 20 extends from the front surface 50 of the semiconductor substrate 2, pierces the top-anode region 23, and reaches the barrier region 25. The pillar region 20 is connected to the front surface electrode 5 and the barrier region 15 or 25. The pillar region 20 is in Schottky-contact with the front surface electrode 5.

A barrier height between the front surface electrode 5 and the pillar regions 20 when titanium (Ti) is used as a material of the front surface electrode 5 is lower than a barrier height between the front surface electrode 5 and the pillar regions 20 when aluminum silicon (AlSi) is used as a material of the front surface electrode 5. Moreover, the barrier height between the front surface electrode 5 and the pillar regions 20 when aluminum silicon (AlSi) is used as a material of the front surface electrode 5 is lower than a barrier height between the front surface electrode 5 and the pillar regions 20 when aluminum (Al) is used as a material of the front surface electrode 5. When titanium (Ti) is used as a material of the front surface electrode 5, the barrier height between the front surface electrode 5 and the pillar regions 20 is low, and hence electrons easily flow from the front surface electrode 5 to the pillar regions 20.

Each gate trench 30 extends from the front surface 50 of the semiconductor substrate 2 to the back surface 60 side (in a z direction). In the IGBT region 3, the gate trench 30 extends from the front surface 50 of the semiconductor substrate 2, pierces the corresponding emitter region 17, the top-body region 16, the barrier region 15, and the bottom-body region 14, and reaches the drift region 13. In the diode region 4, the gate trench 30 extends from the front surface 50 of the semiconductor substrate 2, pierces the anode contact region 24, the top-anode region 23, the barrier region 25, and the bottom-anode region 22, and reaches the drift region 13. Inside the gate trench 30, the gate electrode 32 and a gate insulation film 31 are provided.

Figure 5:
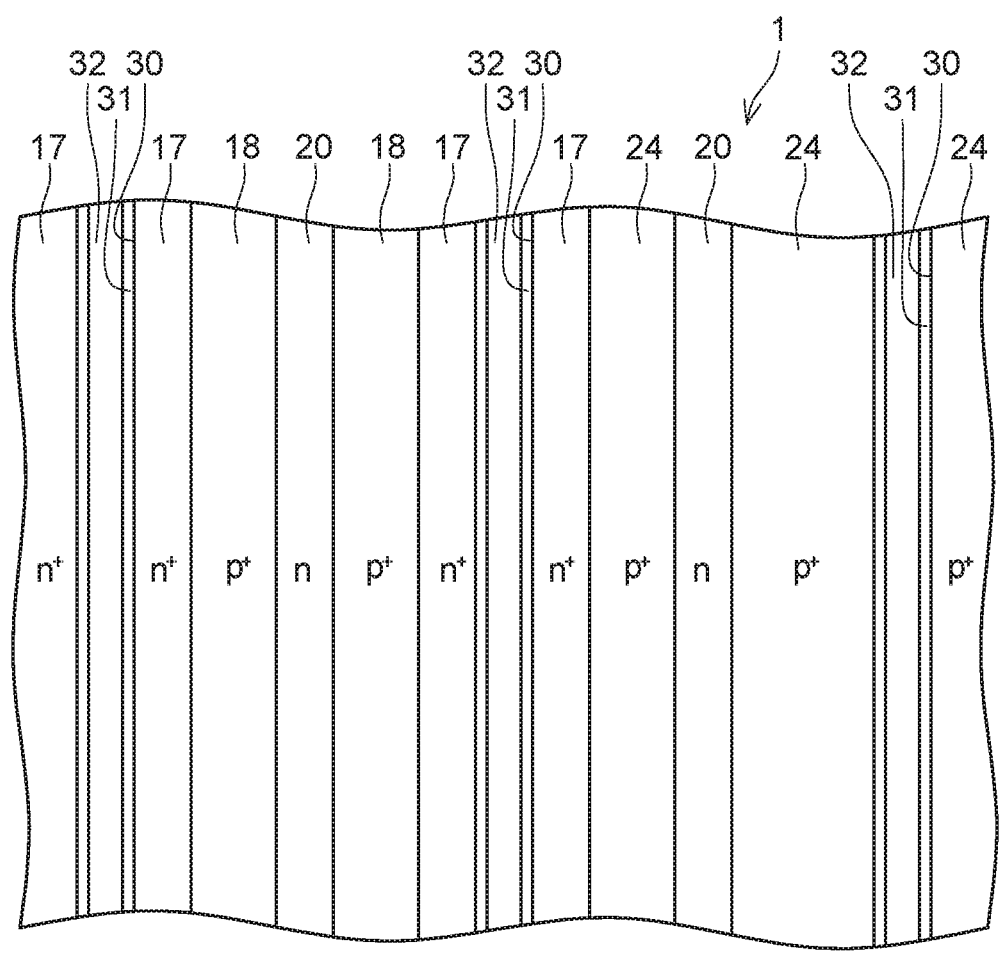
FIG. 5 is a top view of the semiconductor device according to the embodiment.

As shown in FIG. 5, when the front surface 50 of the semiconductor substrate 2 is viewed from a top, each gate trench 30 extends in the y direction. The plurality of gate trenches 30 extend in parallel in the y direction. The plurality of gate trenches 30 is provided at equal intervals in the x direction.

As shown in FIG. 1, each gate electrode 32 is housed inside the corresponding gate trench 30. The gate electrode 32 is housed more inward than the corresponding gate insulation film 31. The gate electrode 32 is configured of aluminum (Al) or polysilicon (Poly Si), for example. An interlayer insulation film 33 is disposed on the gate electrode 32. The interlayer insulation film 33 insulates the corresponding gate electrode 32 from the front surface electrode 5.

Each gate insulation film 31 is configured of silicon oxide (SiO$_2$), for example. The gate insulation film 31 covers an inner surface of the corresponding gate trench 30. The gate insulation film 31 is disposed between the corresponding gate electrode 32 and the semiconductor substrate 2. The gate insulation film 31 insulates the corresponding gate electrode 32 from the semiconductor substrate 2.

Next, an operation of the semiconductor device that comprises the above-described configuration will be described. When the semiconductor device 1 is used, a voltage that makes the back surface electrode 6 positive (i.e., a forward voltage for the IGBT) is applied between the front surface electrode 5 and the back surface electrode 6. Moreover, an ON potential (a potential equal to or higher than a potential required for forming a channel in the bottom-body region 14 and the top-body region 16 in the IGBT region 3, and in the bottom-anode region 22 in the diode region 4) is applied to the gate electrodes 32. The IGBT in the semiconductor device 1 is thereby turned on.

When the IGBT in the semiconductor device 1 is turned on, a channel is formed in a range of each of the bottom-body region 14 and the top-body region 16 that is in contact with the corresponding gate trenches 30, respectively. Moreover, a channel is also formed in a range of the bottom-anode region 22 that is in contact with the corresponding gate trenches 30. At this occasion, the impurity concentration of the top-body region 16 is lower than the impurity concentration of the bottom-body region 14, and hence the threshold value for forming a channel in the top-body region 16 is lower than the threshold value for forming a channel in the bottom-body region 14. Therefore, when the semiconductor device 1 is turned on, a channel is formed earlier in the top-body region 16 than in the bottom-body region 14, and then a channel is formed in the bottom-body region 14. Moreover, the impurity concentration of the top-body region 16 is lower than the impurity concentration of the bottom-anode region 22, and hence the threshold value for forming a channel in the top-body region 16 is lower than the threshold value for forming a channel in the bottom-anode region 22. Therefore, when the semiconductor device 1 is turned on, a channel is formed earlier in the top-body region 16 than in the bottom-anode region 22, and then a channel is formed in the bottom-anode region 22. As shown by an arrow P1 in FIG. 1, electrons then flow from the front surface electrode 5 to the drift region 13 via the emitter regions 17, the channel formed in the top-body region 16, the barrier region 15, and the channel formed in the bottom-body region 14. Afterwards, electrons flow to the back surface electrode 6 via the buffer region 12 and the collector region 11. Moreover, holes flow from the back surface electrode 6 to the front surface electrode 5 via the collector region 11, the buffer region 12, the drift region 13, the bottom-body region 14, the barrier region 15, the top-body region 16, and the body contact regions 18.

Next, when the potential of the gate electrodes 32 is switched from an ON potential to an OFF potential, the channel formed in each of the bottom-body region 14 and the top-body region 16 disappears. Moreover, the channel formed in the bottom-anode region 22 also disappears. The IGBT in the semiconductor device 1 is thereby turned off. Moreover, a voltage that makes the front surface electrode 5 positive (i.e., a forward voltage for the FWD) is applied between the front surface electrode 5 and the back surface electrode 6. The FWD in the semiconductor device 1 is thereby turned on. When the FWD is turned on, holes flow from the front surface electrode 5 to the back surface electrode 6 via the anode contact region 24, the top-anode region 23, the barrier region 25, the bottom-anode region 22, the drift region 13, the buffer region 12, and the cathode region 21. Moreover, electrons flow from the back surface electrode 6 to the front surface electrode 5 via the cathode region 21, the buffer region 12, the drift region 13, the bottom-anode region 22, the barrier region 25, the top-anode region 23, and the anode contact region 24.

As is clear from the description above, in the above-described semiconductor device 1, the impurity concentration of the top-body region 16 is lower than the impurity concentration of the bottom-body region 14, in the IGBT region 3. Due to this, the threshold value for forming a channel in the top-body region 16 is lower than the threshold value for forming a channel in the bottom-body region 14, and hence when the IGBT in the semiconductor device 1 is turned on, a channel is formed earlier in the top-body region 16 than in the bottom-body region 14, and then a channel is formed in the bottom-body region 14.

Moreover, the impurity concentration of the top-body region 16 in the IGBT region 3 is lower than the impurity concentration of the bottom-anode region 22 in the diode region 4. Due to this, the threshold value for forming a channel in the top-body region 16 is lower than the threshold value for forming a channel in the bottom-anode region 22, and hence when the IGBT in the semiconductor device 1 is turned on, a channel is formed earlier in the top-body region 16 than in the bottom-anode region 22, and then a channel is formed in the bottom-anode region 22.

In the above-described conventional art in Japanese Patent Application Publication No. 2013-048230, in contrast to the art disclosed herein, the impurity concentration of the bottom-body region was lower than the impurity concentration of the top-body region, and hence when the IGBT in the semiconductor device was turned on, a channel was formed earlier in the bottom-body region than in the top-body region, and then a channel was formed in the top-body region. Moreover, the impurity concentration of the bottom-anode region was lower than the impurity concentration of the top-body region, and hence when the IGBT in the semiconductor device was turned on, a channel was formed earlier in the bottom-anode region than in the top-body region, and then a channel was formed in the top-body region.

Figure 6:
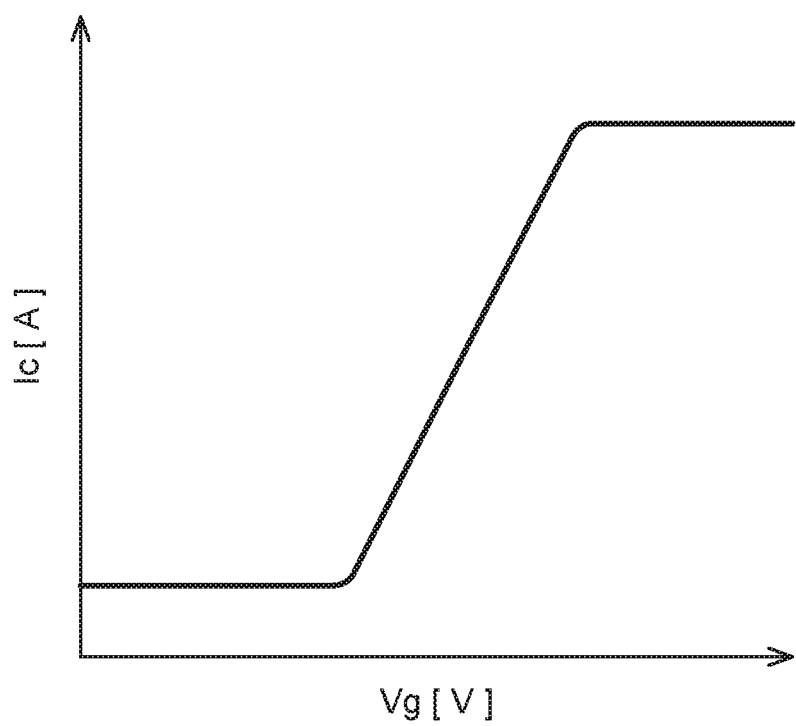
FIG. 6 is a diagram that shows an Ic-Vg characteristic of the semiconductor device according to the embodiment.

Consequently, when the IGBT in the semiconductor device was turned on, electrons flowed by bypassing the top-body region as a first step, and then flowed without bypassing the top-body region as a second step, to thereby cause the electrons to flow in two steps, resulting in a phenomenon referred to as two-step ON. However, in the art disclosed herein, when the IGBT in the semiconductor device 1 is turned on, a channel is formed earlier in the top-body region 16 than in the bottom-anode region 22 and the bottom-body region 14, and hence electrons flow without bypassing the top-body region 16. As shown in FIG. 6, when the IGBT in the semiconductor device 1 is turned on, electrons thereby do not flow in two steps, and hence the two-step ON phenomenon can be suppressed.

Moreover, if titanium (Ti) is used as a material of the front surface electrode 5, the barrier height between the front surface electrode 5 and the pillar regions 20 becomes low, and hence electrons easily flow from the front surface electrode 5 to the pillar regions 20, and easily bypass the top-body region 16. Accordingly, if titanium (Ti) is used as a material of the front surface electrode 5, the above-described configuration in which the impurity concentration of the top-body region 16 is lower than the impurity concentration of the bottom-body region 14 is particularly effective, in order to suppress electrons bypassing the top-body region 16.

Figure 7:
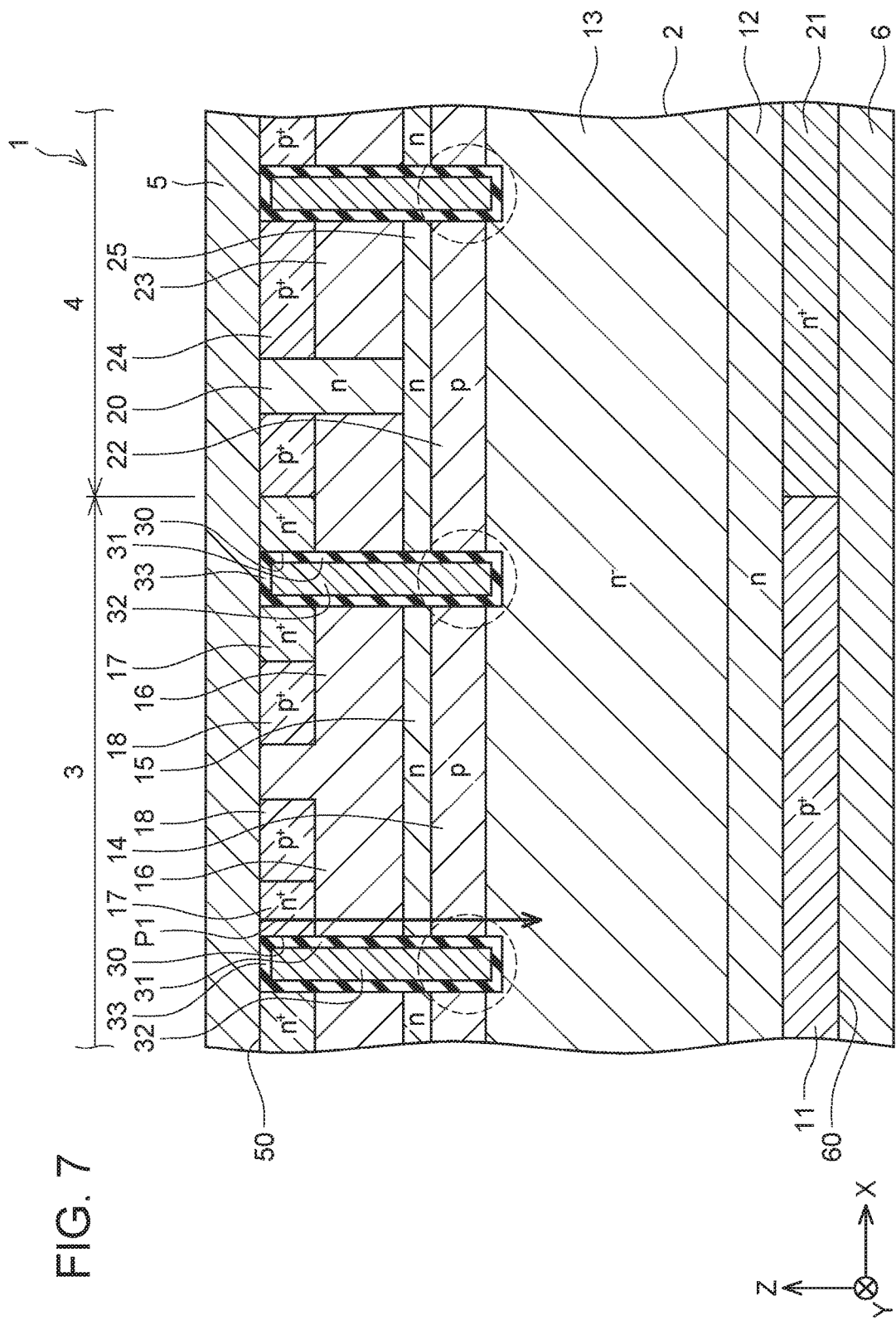
FIG. 7 is a cross-sectional view of a semiconductor device according to another embodiment.
Figure 8:
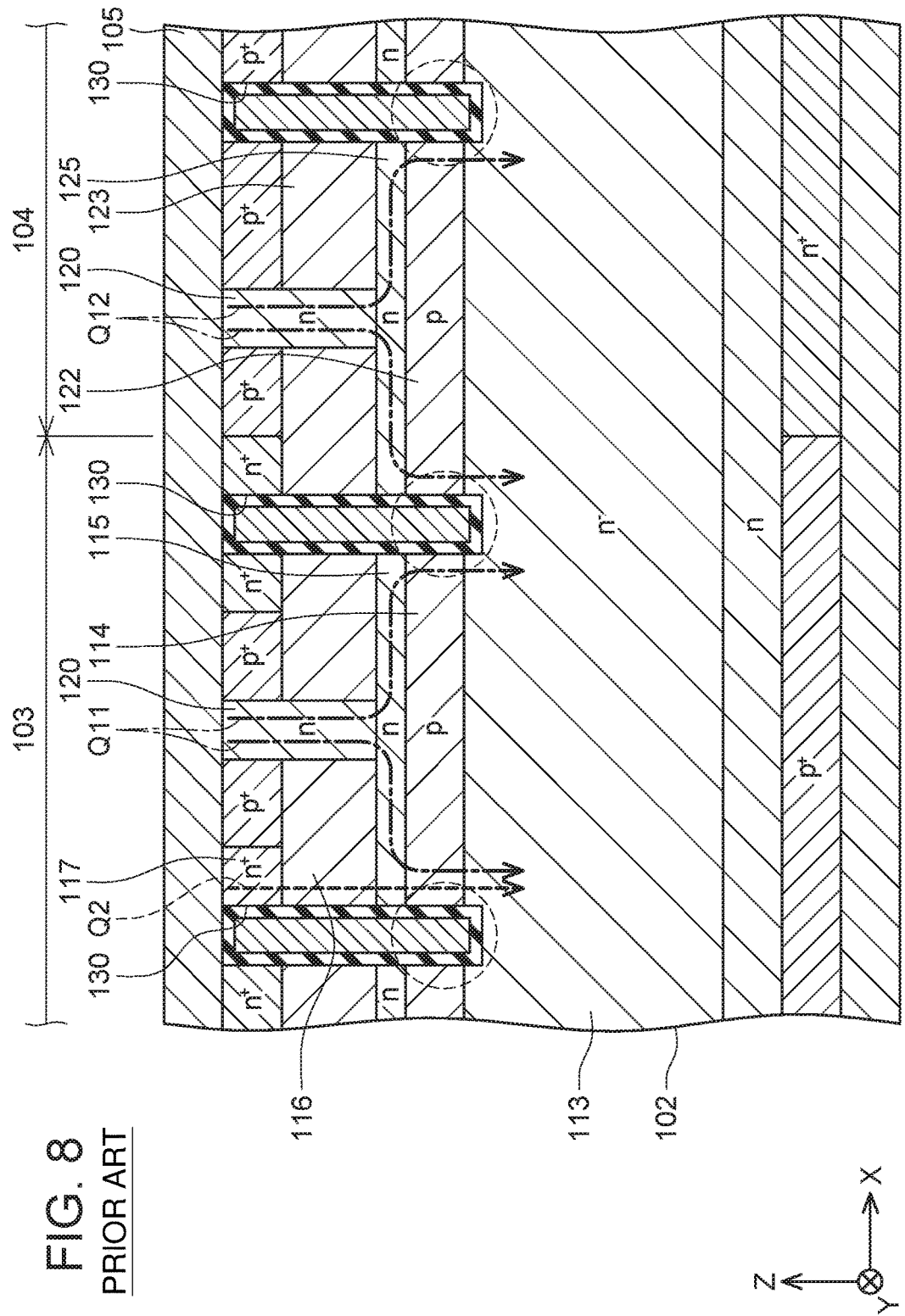
FIG. 8 is a cross-sectional view of a conventional semiconductor device.
Figure 9:
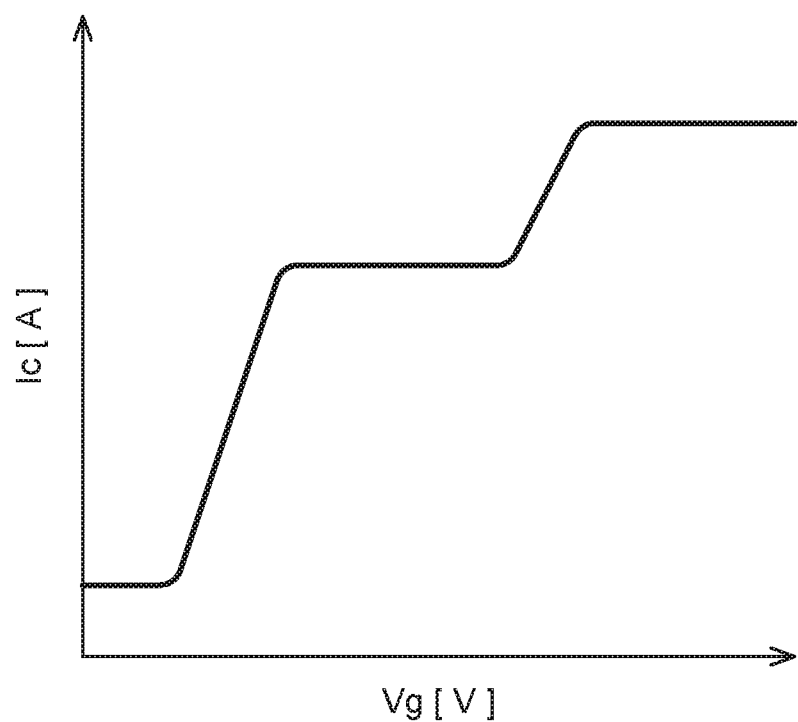
FIG. 9 is a diagram that shows an Ic-Vg characteristic of the conventional semiconductor device.

An embodiment has been described above in detail. However, specific aspects thereof are not limited to the above-described embodiment. For example, although the pillar region 20 is provided in the IGBT region 3 in the above-described embodiment, the present invention is not limited to this configuration, and as shown in FIG. 7, the pillar region 20 may not be provided in the IGBT region 3. In other words, the pillar region 20 can be omitted in the IGBT region 3.

In a semiconductor device shown in FIG. 7, the impurity concentration of the top-body region 16 in the IGBT region 3 is lower than the impurity concentration of the bottom-anode region 22 in the diode region 4. Accordingly, the threshold value for forming a channel in the top-body region 16 is lower than the threshold value for forming a channel in the bottom-anode region 22, and hence when the IGBT in the semiconductor device 1 is turned on, a channel is formed earlier in the top-body region 16 than in the bottom-anode region 22, and then a channel is formed in the bottom-anode region 22.

Specific examples of the present invention have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

Examples of the respective technical elements disclosed in this specification are explained below. It should be noted that the respective technical elements are independent of one another, and are useful solely or in combinations.

The front surface electrode may be configured of titanium.

If the front surface electrode is configured of Ti, the barrier height between the front surface electrode and the pillar region is low, and hence electrons easily flow from the front surface electrode to the pillar region. Therefore, electrons easily flow to the drift region via the pillar region, the barrier region, and the channel formed in the bottom-body region. In other words, electrons easily flow by bypassing the top-body region. In such a configuration, in order to prevent electrons from flowing bypassing the top-body region, the configuration in which a channel is formed earlier in the top-body region than in the bottom-body region is particularly effective.

What is claimed is:
1. A semiconductor device comprising:
a semiconductor substrate; and
a front surface electrode configured of metal provided on a front surface of the semiconductor substrate,
wherein
the semiconductor substrate comprises an IGBT (Insulated Gate Bipolar Transistor) region and a diode region,
the IGBT region comprises:
an n-type IGBT drift region;
a p-type bottom-body region provided on a front surface side of the IGBT drift region;
an n-type IGBT barrier region provided on a front surface side of the bottom-body region;
a p-type top-body region provided on a front surface side of the IGBT barrier region;
an n-type emitter region provided on a front surface side of the top-body region; and a gate trench extending from the front surface of the semiconductor substrate, piercing the emitter region, the top-body region, the IGBT barrier region and the bottom-body region, and reaching the IGBT drift region, and the diode region comprises:

an n-type diode drift region;

a p-type bottom-anode region provided on a front surface side of the diode drift region;

an n-type diode barrier region provided on a front surface side of the bottom-anode region;

a p-type top-anode region provided on a front surface side of the diode barrier region;

an n-type pillar region extending from the front surface of the semiconductor substrate, piercing the top-anode region, and reaching the diode barrier region, and connected to the front surface electrode and the diode barrier region; and a gate trench extending from the front surface of the semiconductor substrate, piercing the top-anode region, the diode barrier region and the bottom-anode region, and reaching the diode drift region, wherein an average impurity concentration of the top-body region is lower than an average impurity concentration of the bottom-anode region.

2. The semiconductor device according claim 1, wherein the front surface electrode is configured of titanium.

3. The semiconductor device according claim 1, wherein a highest impurity concentration of the top-body region is lower than a lowest impurity concentration of the bottom-anode region.

* * * * *